(12) United States Patent
Ahmadian et al.

(10) Patent No.: US 10,995,402 B2
(45) Date of Patent: May 4, 2021

(54) SYSTEM AND METHOD FOR LOW THERMAL SHOCK-FAST COOLING OF THERMAL BARRIER COATING

(71) Applicant: Raytheon Technologies Corporation, Farmington, CT (US)

(72) Inventors: Shayan Ahmadian, Oakdale, CT (US); Hoyt Y. Chang, Manchester, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 16/884,602

(22) Filed: May 27, 2020

(65) Prior Publication Data

US 2020/0318231 A1 Oct. 8, 2020

Related U.S. Application Data

(62) Division of application No. 15/014,232, filed on Feb. 3, 2016.

(51) Int. Cl.
*C23C 14/58* (2006.01)
*C23C 14/30* (2006.01)

(52) U.S. Cl.
CPC .......... *C23C 14/5806* (2013.01); *C23C 14/30* (2013.01)

(58) Field of Classification Search
None
See application file for complete search history.

(56) References Cited

U.S. PATENT DOCUMENTS

| 4,575,608 | A  | 3/1986  | Wictorin et al. |
|-----------|----|---------|-----------------|
| 5,099,586 | A  | 3/1992  | Anderson        |
| 5,882,415 | A  | 3/1999  | Helling et al.  |
| 5,989,343 | A  | 11/1999 | Borom et al.    |
| 6,589,351 | B1 | 7/2003  | Bruce et al.    |
| 6,770,333 | B2 | 8/2004  | Bruce et al.    |
| 6,946,034 | B1 | 9/2005  | Bruce et al.    |
| 7,229,701 | B2 | 6/2007  | Madhava et al.  |
| 8,328,945 | B2 | 12/2012 | Gero et al.     |
| 8,350,180 | B2 | 1/2013  | Neal et al.     |
| 9,187,815 | B2 | 11/2015 | Gero et al.     |
| 2001/0015746 | A1 | 8/2001 | Yosimura et al. |
| 2006/0002112 | A1 | 1/2006 | Kling           |
| 2007/0259173 | A1 | 11/2007 | Refke et al.   |

FOREIGN PATENT DOCUMENTS

| CN | 202238582 U  | 5/2012 |
|----|--------------|--------|
| DE | 19908387 A1  | 9/1999 |
| EP | 1791989 B1   | 9/2010 |
| JP | S62111485 A  | 5/1987 |

OTHER PUBLICATIONS

European Search Report dated Jul. 3, 2017 issued for corresponding European Patent Application No. 17154312.7.

*Primary Examiner* — Joel G Horning
(74) *Attorney, Agent, or Firm* — Bachman & LaPointe, P.C.

(57) ABSTRACT

A coating system including a reflective cool down chamber with at least one arcuate wall; and an infrared lamp directed at the arcuate wall.

11 Claims, 3 Drawing Sheets

SYSTEM AND METHOD FOR LOW THERMAL SHOCK-FAST COOLING OF THERMAL BARRIER COATING

This application is a divisional of U.S. patent application Ser. No. 15/014,232, filed Feb. 3, 2016.

BACKGROUND

The present disclosure relates to a system for thermal barrier coatings (TBCs), and more particularly, to thermal control therein.

Thermal barrier coatings (TBCs) are multilayer materials that are typically applied to hot sections of an engine to reduce the surface temperature experienced by workpieces. TBCs often include (1) a substrate, which may be an engine workpiece—typically a gamma-gamma prime superalloy (2) an aluminum rich bond coat (3) thermally grown oxide (TGO) that reduce further oxidation of bond coat by blocking oxygen (4) a low thermal conductivity ceramic top coat.

One of the fabrication methods for top coat is electron beam-physical vapor deposition (EB-PVD) in which a columnar top coat microstructure develops on the surface of the workpieces in near vacuum at elevated temperatures. EB-PVD is a form of physical vapor deposition in which an ingot of material is bombarded with an electron beam given off by a charged tungsten filament under high vacuum. The electron beam causes atoms from the ingot to transform into the gaseous phase. These atoms then condense into solid form, coating the workpiece in the vacuum chamber, and within a line of sight, with a thin layer of the material.

To reduce the thermal shock between the ceramic top coat and the metallic bond coat post top coating, workpieces are slowly cooled down to room temperature in a preheated oven. The aforementioned method of cool down may be time consuming and not cost effective.

SUMMARY

A coating system according to one disclosed non-limiting embodiment of the present disclosure can include a reflective cool down chamber with at least one arcuate wall and an infrared lamp directed at the arcuate wall.

A further embodiment of the present disclosure may include wherein the at least one arcuate wall includes an interior surface with a high index of reflection.

A further embodiment of the present disclosure may include wherein the at least one arcuate wall includes an interior surface with a mirror finish.

A further embodiment of the present disclosure may include, wherein the infrared lamp is located on a movable door that permits intake of a workpiece holder.

A further embodiment of the present disclosure may include, wherein the infrared lamp is located on a movable door that permits egress of a workpiece holder.

A further embodiment of the present disclosure may include a diffusion lens mounted to the infrared lamp.

A further embodiment of the present disclosure may include a diffusion chamber adjacent to the reflective cool down chamber.

A further embodiment of the present disclosure may include, wherein the diffusion chamber is an electron beam physical vapor deposition (EB PVD).

A method coating a workpiece according to one disclosed non-limiting embodiment of the present disclosure can include moving a workpiece holder from a deposition chamber a reflective cool down chamber with at least one arcuate wall; and directing infrared energy from an infrared lamp at the arcuate wall to reduce a temperature gradient of a workpiece.

A further embodiment of the present disclosure may include directing the infrared energy for 3-10 seconds.

A further embodiment of the present disclosure may include diffusing the infrared energy.

A further embodiment of the present disclosure may include locating the infrared lamp on a door of the reflective cool down chamber.

A further embodiment of the present disclosure may include, wherein the diffusion chamber is an electron beam physical vapor deposition (EB PVD).

A further embodiment of the present disclosure may include operating the infrared energy for a time in response to a thermal mass of the workpiece.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiment. The drawings that accompany the detailed description can be briefly described as follows.

DETAILED DESCRIPTION

Figure 1:
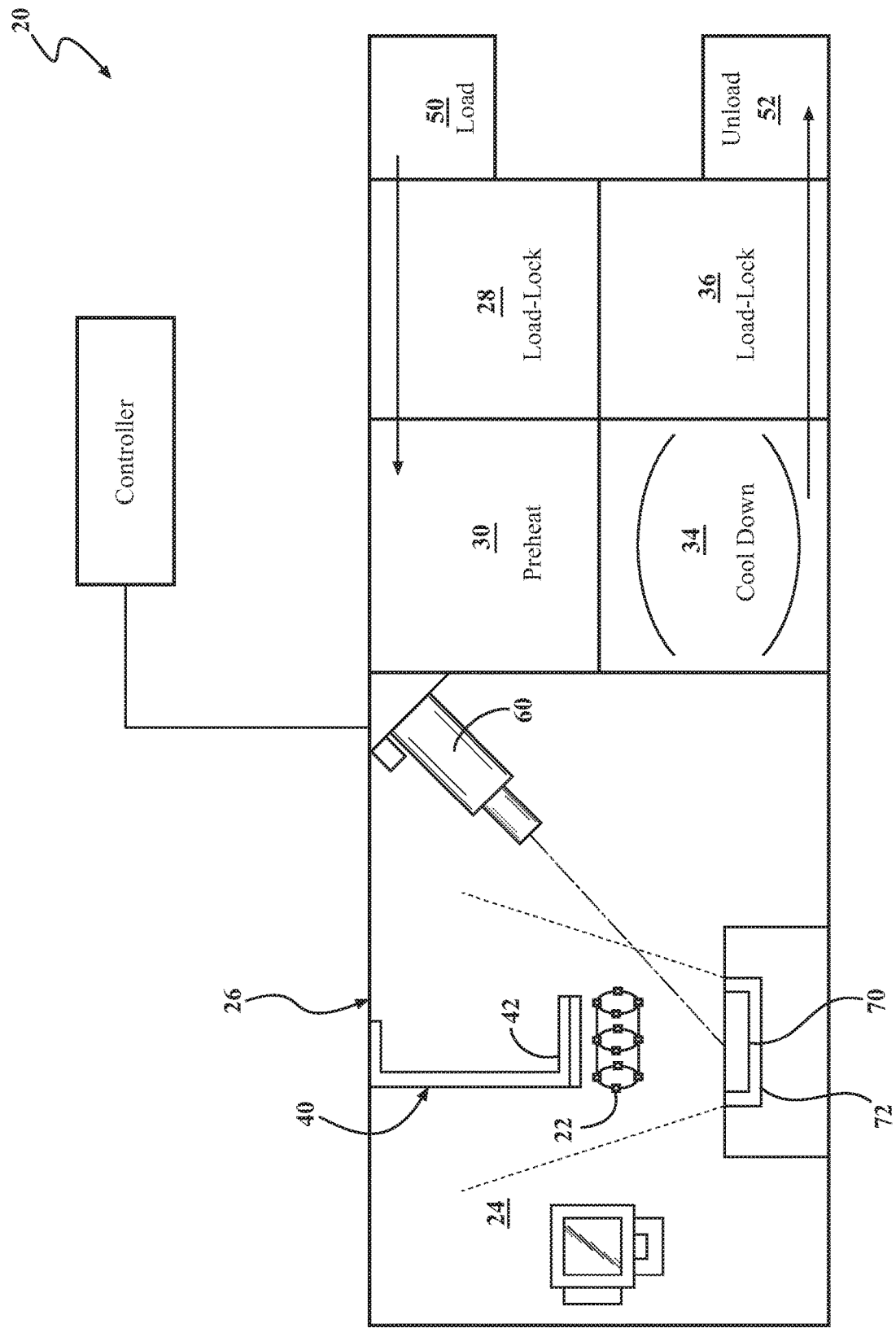
FIG. 1 is a partial schematic view of a deposition system.

FIG. 1 schematically illustrates an example system 20 for depositing coating on workpieces 22 in the interior 24 of a deposition chamber 26. The system 20 passes the workpiece 22 downstream along a workpiece flowpath sequentially through a first load lock chamber 28 forming an in-feed chamber, a preheat chamber 30, the deposition chamber 26, a cool down chamber 34, and a second load lock chamber 36.

Each of a multiple of workpieces 22 may be conveyed through the system on a workpiece holder 40 of which, depending upon implementation, may support a single workpiece or multiple workpieces. In the deposition chamber 26, the workpiece holder 40 may be manipulated by a sting mechanism 42. In one embodiment, a loading station 50 and an unloading station 52 are provided. These may include robots (e.g., six-axis industrial robots) to transfer fixture workpieces from and to conveyors, pallets, and the like.

After deposition is complete, the sting mechanism 42 is withdrawn back through the preheat chamber 30 into the first load lock chamber 28, such that the workpieces may be removed from the deposition chamber 26.

The exemplary deposition chamber 26 is configured for electron beam physical vapor deposition (EB-PVD). In this example, at least one electron beam (EB) gun 60 is positioned to direct its beam to one or more deposition material ingots 70, 72. In this example, there are two ingots 70, 72 of different materials. The ingots may be ceramics of different composition for forming distinct layers in a thermal barrier coating, erosion coating, abradable coating, or abrasive coating. For example, Zirconia-based ingot examples include, but are not limited to, an yttria-stabilized zirconia (YSZ) such as 7YSZ, a gadolinia-stabilized zirconia, or an YSZ of different yttria content or dopant.

Figure 2:
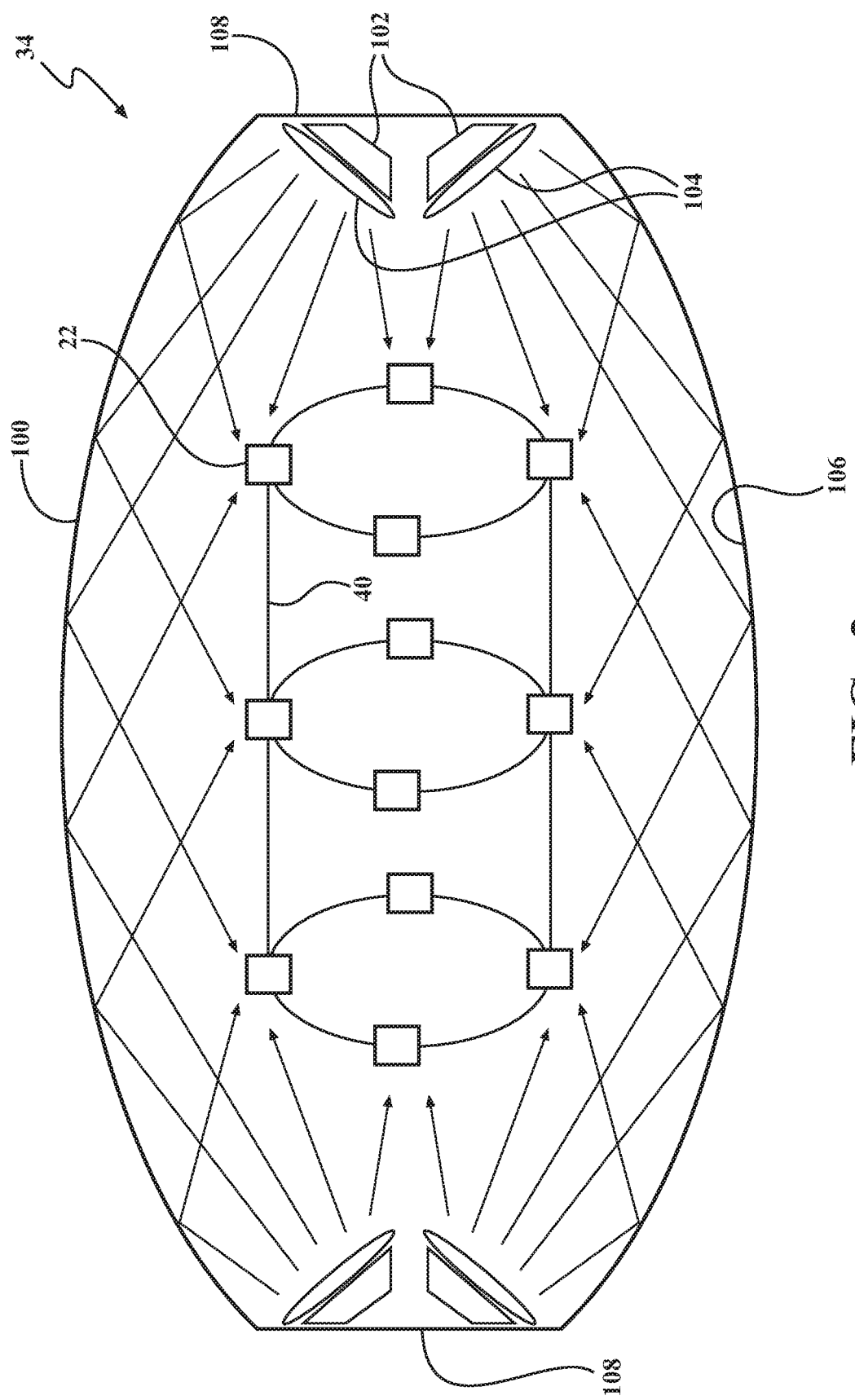
FIG. 2 is a schematic view a reflective cool down chamber.

With reference to FIG. 2, in one exemplary implementation, the reflective cool down chamber 34 provides a reflective chamber that includes an arcuate wall 100 and one or more infrared lamps 102 that have diffusing lenses 104 such that the reflective cool down chamber 34 forms an ovid-like shape. The infrared lamps 102 may, for example, be located on a movable door 108 that permits entry and/or egress of the workpiece holder 40. The exact size and shape may be optimized such that the workpieces are cooled down slowly and uniformly. An interior surface 106 of the arcuate wall 100 provides a high index of reflection, e.g., mirror polish aluminum, stainless steel, etc. The cooling workpiece dissipates heat primarily through radiation and the reflective arcuate wall 100 of the reflective cool down chamber 34 reflects radiation back to the workpieces, thereby reducing the cooling rate.

The infrared lamps 102 may be located on movable doors 108 that permit intake and egress of the workpiece holder 40. The infrared lamps 102 increase heat to make up for heat loss to the interior surface 106 of the arcuate wall 100 and also reduce the cooling rate. The orientation of the infrared lamps 102 is configured to uniformly distribute heat to the workpieces. Thus, temperature gradients in the workpiece are significantly reduced.

The diffusing lenses 104 facilitate diffusion of the radiation in a suitably wide cone to permit uniform heating. The reflective cool down chamber 34 and infrared lamps 102 may be used in conjunction with various existing coaters. The infrared lamps 102 can be turned on and off quickly, unlike a heating oven that requires a relatively long time to heat up and cool down.

Figure 3:
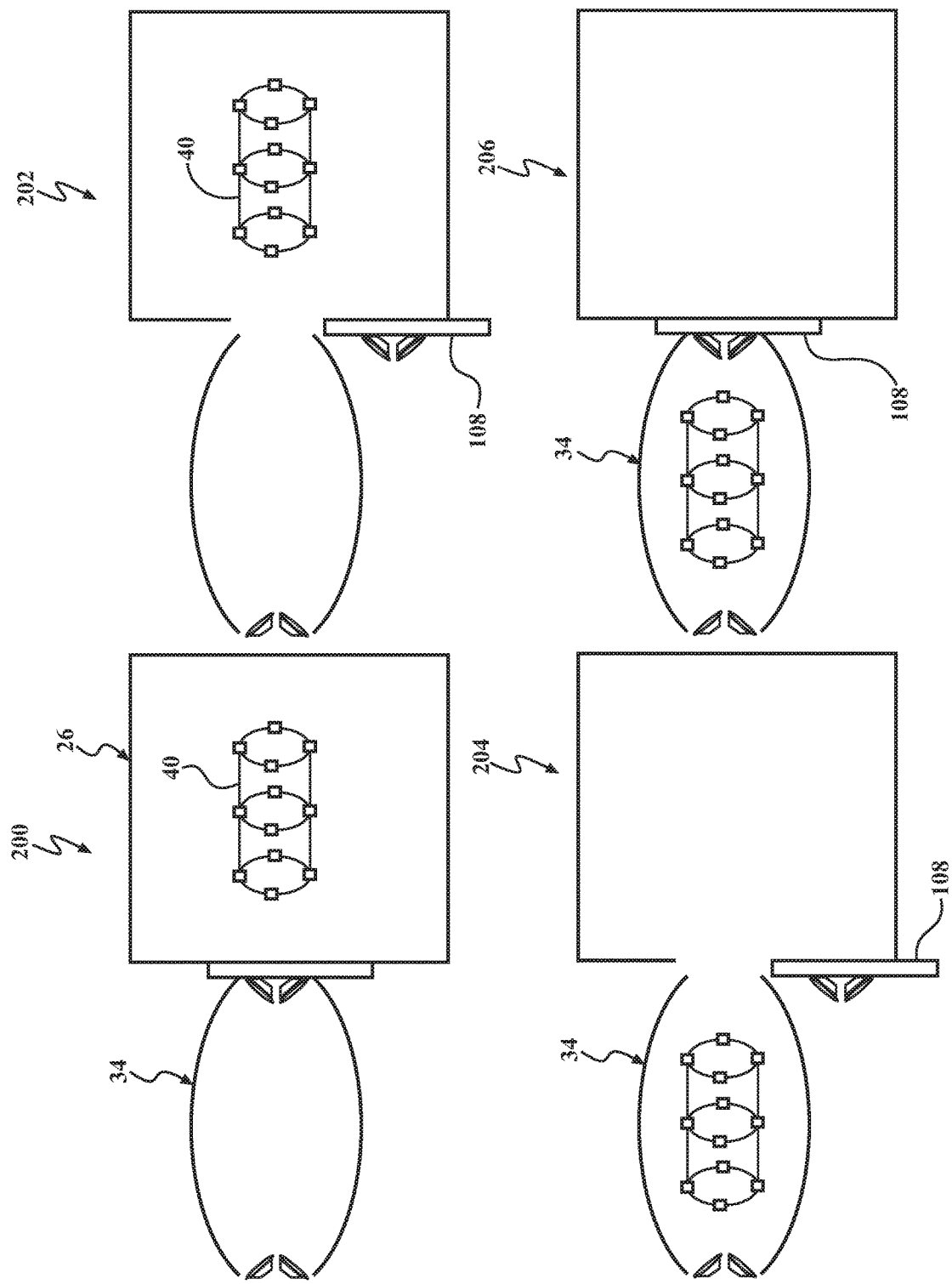
FIG. 3 is a schematic view of the reflective cool down chamber operation.

With reference to FIG. 3, the reflective cool down chamber 34 is adjacent to the deposition chamber 26 such that after the coating process is complete (step 206), the door 108 opens (step 202) such that the workpieces, which are supported by workpiece holder 40, are moved from the deposition chamber 26 to the reflective cool down chamber 34 (step 204). The movable doors 108 are then closed and the infrared lamps 102 are activated (step 206). In one example, the infrared lamps 102 may be activated for about 3-10 seconds such that the infrared energy is provided in response to a thermal mass of the workpiece. The workpieces are then cooled within the reflective cool down chamber 34 at a suitable rate, to prevent spallation.

The use of the terms "a," "an," "the," and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a workpiece component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed:

1. A method for coating a workpiece, comprising:
   moving a workpiece holder from an electron beam physical vapor deposition (EB-PVD) deposition chamber to a reflective cool down chamber with at least one arcuate wall surrounding the workpiece holder; and
   directing infrared energy from an infrared lamp through a diffusion lens within the reflective cool down chamber at the arcuate wall to reflect radiation from the arcuate wall toward the workpiece holder to uniformly distribute heat from the arcuate wall toward a multiple of workpieces retained by the workpiece holder within the reflective cool down chamber reducing a cooling rate of the multiple of workpieces.

2. The method as recited in claim 1, further comprising directing the infrared energy for 3-10 seconds.

3. The method as recited in claim 1, further comprising diffusing the infrared energy.

4. The method as recited in claim 1, further comprising locating the infrared lamp on a door of the reflective cool down chamber, the door between the deposition chamber and the reflective cool down chamber.

5. The method as recited in claim 1, further comprising operating the infrared energy for a time in response to a thermal mass of the workpiece.

6. The method as recited in claim 1, wherein cooling the multiple of workpieces comprises dissipating heat through radiation.

7. A method for coating a workpiece, comprising:
   coating a multiple of workpieces on a workpiece holder via an electron beam physical vapor deposition (EB-PVD) within an electron beam physical vapor deposition (EB-PVD) deposition chamber;
   moving the workpiece holder from the electron beam physical vapor deposition (EB-PVD) deposition chamber to a reflective cool down chamber with at least one arcuate wall surrounding the workpiece holder; and
   directing infrared energy from an infrared lamp through a diffusion lens within the reflective cool down chamber at the arcuate wall to reflect radiation from the arcuate wall toward the workpiece holder to uniformly distribute heat from the arcuate wall toward the multiple of workpieces retained by the workpiece holder within the reflective cool down chamber reducing a cooling rate of the multiple of workpieces.

8. The method as recited in claim 7, wherein cooling the multiple of workpieces comprises dissipating heat through radiation.

9. The method as recited in claim 8, further comprising operating the infrared energy for a time in response to a thermal mass of the workpiece.

10. The method as recited in claim 7, further comprising diffusing the infrared energy prior to the reflecting.

11. The method as recited in claim 7, further comprising locating the infrared lamp on a door of the reflective cool down chamber, the door between the deposition chamber and the reflective cool down chamber.

* * * * *